(12) United States Patent
Whitbread et al.

(10) Patent No.: US 10,942,380 B2
(45) Date of Patent: Mar. 9, 2021

(54) ELECTRICAL ISOLATION IN PHOTONIC INTEGRATED CIRCUITS

(71) Applicant: OCLARO TECHNOLOGY LIMITED, Towcester (GB)

(72) Inventors: Neil David Whitbread, Towcester (GB); Stephen Jones, Northamptonshire (GB)

(73) Assignee: Lumentum Technology UK Limited, Northamptonshire (GB)

( * ) Notice: Subject to any disclaimer, the term of this patent is extended or adjusted under 35 U.S.C. 154(b) by 0 days.

(21) Appl. No.: 16/474,977

(22) PCT Filed: Dec. 29, 2017

(86) PCT No.: PCT/EP2017/084855
§ 371 (c)(1),
(2) Date: Jun. 28, 2019

(87) PCT Pub. No.: WO2018/122393
PCT Pub. Date: Jul. 5, 2018

(65) Prior Publication Data
US 2019/0324300 A1   Oct. 24, 2019

(30) Foreign Application Priority Data
Dec. 30, 2016   (GB) .................................... 1622437.0

(51) Int. Cl.
*G02F 1/017*   (2006.01)
*H01L 21/761*   (2006.01)
(Continued)

(52) U.S. Cl.
CPC ........ *G02F 1/01708* (2013.01); *H01L 21/761* (2013.01); *H01L 21/76237* (2013.01);
(Continued)

(58) Field of Classification Search
CPC . H01L 21/761; H01L 21/76237; H01S 5/026; H01S 5/0265; H01S 5/343;
(Continued)

(56) References Cited

U.S. PATENT DOCUMENTS 3,984,262 A   10/1976 Burnham et al.
5,815,615 A *  9/1998 Taneya ............... G02B 6/12004
                                                   385/50

(Continued)

FOREIGN PATENT DOCUMENTS

EP      0487192 A2    5/1992
WO   2007107782 A1    9/2007

OTHER PUBLICATIONS

PCT International Search Report and Written Opinion corresponding to PCT/EP2017/084855, dated Mar. 27, 2018, 10 pages.

*Primary Examiner* — Thomas A Hollweg
*Assistant Examiner* — Mary A El-Shammaa
(74) *Attorney, Agent, or Firm* — Harrity & Harrity, LLP

(57) ABSTRACT

A method of providing electrical isolation between subsections in a waveguide structure for a photonic integrated device, the structure comprising a substrate, a buffer layer and a core layer, the buffer layer being located between the substrate and the core and comprising a dopant of a first type, the first type being either n-type or p- type, the method comprising the steps of prior to adding any layer to a side of the core layer opposite to the buffer layer: selecting at least one area to be an electrical isolation region, applying a dielectric mask to a surface of the core layer opposite to the buffer layer, with a window in the mask exposing an area of the surface corresponding to the selected electrical isolation region, implementing diffusion of a dopant of a second type, the second type being of opposite polarity to the first type,
(Continued)

and allowing the dopant of the second type to penetrate to the substrate to form a blocking junction.

20 Claims, 15 Drawing Sheets

(51) Int. Cl.
  *H01L 21/762* (2006.01)
  *H01S 5/02* (2006.01)
  *H01S 5/026* (2006.01)
  *H01S 5/343* (2006.01)
  *H01S 5/50* (2006.01)
  *H01S 5/0625* (2006.01)

(52) U.S. Cl.
  CPC ............ *H01S 5/026* (2013.01); *H01S 5/0208* (2013.01); *H01S 5/343* (2013.01); *H01S 5/50* (2013.01); *G02F 2202/101* (2013.01); *G02F 2202/102* (2013.01); *G02F 2202/108* (2013.01); *G02F 2203/50* (2013.01); *G02F 2203/70* (2013.01); *H01S 5/0625* (2013.01)

(58) Field of Classification Search
  CPC .............. H01S 5/0208; G02F 1/01708; G02F 2202/101; G02F 2202/102; G02F 2202/108; G02F 2203/50; G02F 2203/70
  See application file for complete search history.

(56) References Cited

U.S. PATENT DOCUMENTS

| | | | |
|---|---|---|---|
| 2003/0042501 | A1 | 3/2003 | Greenwald |
| 2003/0173571 | A1 | 9/2003 | Kish et al. |
| 2004/0008960 | A1* | 1/2004 | Rantala ................. G02B 6/1221 385/129 |
| 2004/0119079 | A1* | 6/2004 | Hayakawa .......... H01S 5/06258 257/80 |
| 2004/0175852 | A1* | 9/2004 | Ooi ........................ B82Y 20/00 438/22 |
| 2005/0275053 | A1 | 12/2005 | Shimizu |
| 2011/0243494 | A1* | 10/2011 | Hasegawa ............. B82Y 20/00 385/14 |

* cited by examiner

ELECTRICAL ISOLATION IN PHOTONIC INTEGRATED CIRCUITS

CROSS-REFERENCE TO RELATED APPLICATIONS

This application is a 371 national stage of PCT Application No. PCT/EP2017/084855, filed on Dec. 29, 2017 and entitled "ELECTRICAL ISOLATION IN PHOTONIC INTEGRATED CIRCUITS," which claims priority to United Kingdom Patent Application No. 1622437.0, filed on Dec. 30, 2016 and entitled "ELECTRICAL ISOLATION IN PHOTONIC INTEGRATED CIRCUITS," which are incorporated by reference herein.

TECHNICAL FIELD

The present disclosure relates to electrical isolation of components in photonic integrated circuits.

BACKGROUND

Photonic integrated circuits (PIC) or integrated optical circuits are devices that integrate multiple photonic functions, such as semi-conductor optical amplifiers, laser sections, modulators etc. FIG. 1 is a cross section view of a typical device, which comprises two semi-conductor optical amplifiers (SOA) 101, a phase modulator 102 and a complementary tap detector (CTAP) 103, with cathode 104. These devices are optically connected by the core layer 105, which is located between an overgrowth layer 106 and a buffer layer 107, the latter supported by a semi-insulating substrate 108.

A challenge in such structures is to provide effective electrical isolation of individual elements of the PIC on a semi-insulating (SI) substrate. The aim is to reduce electrical crosstalk, minimise quiescent currents induced by different bias levels and/or allow series connection of the elements.

Techniques for producing electrical isolation zones include the incorporation of dopant impurities to create regions of electrical isolation by means of melt growth, epitaxial growth (including selective etching or selective area growth), diffusion, implantation, and quantum well intermixing (QWI). By means of such techniques insulating layers or regions of layers that are parallel with the plane of the semiconductor wafer can be created. Also such techniques can be used to create barriers or partial barriers that are perpendicular to the plane of the wafer, and it is known to use layer and barrier features in combination.

Previously, isolation has been achieved by a simple combination of layer and barrier features in which deep implantation regions may be used in combination with a semi-insulating (SI) substrate to create complete electrical isolation between sub-devices, as in the arrangement shown FIG. 2. In such an arrangement three sub-devices 201, 202 and 203 are formed within upper and lower cladding layers 204, 205 applied to a substrate 206 with an active layer 207 therebetween. The three sub-devices have separate lower electrodes 208, 209 and 210 and upper electrodes 211, 212 and 213, and the three sub-devices are completely electrically isolated from one another by deep vertical isolation zones 214 and 215 formed by ion implantation and extending as far as the semi-insulating substrate 206.

The problem is that these elements are connected by a semiconductor optical waveguide, so isolating by deep etching into the substrate would incur unacceptable optical losses and back-reflections. In the scheme described here, deep etching is used to electrically isolate elements not connected by a waveguide.

Implantation is also not a practical option since, to avoid the effects of annealing, this would have to be performed after the final epitaxial growth stage therefore requiring a very deep (~5 µm) implant. The ion-energy required to penetrate to this depth would be very expensive, performed off-site and not compatible with current masking techniques.

SUMMARY

According to a first aspect, there is provided a method of providing electrical isolation between subsections in a waveguide structure for a photonic integrated device. The structure comprises a substrate, a buffer layer and a core layer, the buffer layer being located between the substrate and the core and comprising a dopant of a first type being either n-type or p- type. The method comprises, prior to adding any layer to a side of the core layer opposite to the buffer layer, diffusing a dopant of a second type into the structure, the second type being of opposite polarity to the first type, and allowing the dopant of the second type to penetrate to the substrate to form a blocking junction.

The step of diffusing the dopant into the structure may comprise selecting at least one area to be an electrical isolation region, applying a dielectric mask to a surface of the core layer opposite to the buffer layer, with a window in the mask exposing an area of the surface corresponding to the selected electrical isolation region, The method may further comprise removing dopant from the core layer by etching and re-growing at least a portion of the core layer.

In an embodiment, the method further comprises the step of adding an overgrowth layer with a dopant of the second type on top of the core layer.

In an embodiment, the method further comprises the step of creating an isolation region in the overgrowth layer corresponding to the electrical isolation region by Helium implantation.

In an embodiment, the dopant of the first type is n-type dopant and dopant of the second type is p-type dopant.

In an embodiment, the dopant of the second type is zinc.

In an embodiment, the dopant of the second type is magnesium.

In an embodiment, the waveguide structure further comprises a diffusion barrier layer between the substrate and the buffer.

In an embodiment, the waveguide structure further comprises a diffusion barrier layer within the buffer layer.

In an embodiment, the buffer layer comprises a first sublayer, adjacent the substrate, which comprises the diffusion barrier layer, and a second sublayer, between the first sublayer and the core, which does not have a diffusion barrier layer.

In an embodiment, wherein the buffer layer comprises three sublayers, a first sublayer adjacent the substrate, which has no diffusion barrier, a second sublayer, adjacent the core, which has no diffusion barrier, and a third sublayer, between the first and second sublayers, which comprises a diffusion barrier.

In an embodiment, wherein the first sublayer is thinner than the second sublayer.

In an embodiment, the diffusion buffer layer comprises one of: Aluminium Indium Arsenide, Aluminium Gallium Indium Arsenide, Indium Gallium Arsenide and Indium Gallium Arsenide Phosphide.

According to a second aspect, there is provided a waveguide structure for a photonic integrated circuit comprising a substrate, a buffer layer comprising dopant of a first type and a core layer, wherein the buffer layer is located between the substrate and the core layer. The waveguide structure further comprises at least one electrical isolation region, the region comprising a first isolation region within the buffer layer and comprising dopant of a second type diffused into the first region, the dopant of the first type and the dopant of the second type being of opposite polarities.

In an embodiment, the waveguide structure further comprises an overgrowth layer comprising dopant of the second type, and wherein the core layer is located between the buffer layer and overgrowth layer.

In an embodiment, the electrical isolation region further comprises a second isolation region within the overgrowth layer, comprising helium ions implanted into the overgrowth layer.

According to a third aspect, there is provided a photonic integrated circuit comprising a waveguide structure according to the second aspect.

In an embodiment, the photonic integrated circuit further comprises at least two optoelectronic devices at least partly embedded into the waveguide structure and a photonic integrated circuit comprising a waveguide structure according to the second aspect.

BRIEF DESCRIPTION OF DRAWINGS

The above and other aspects of the present invention will now be described by way of example only, with reference to the following figures.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art.

The present disclosure is directed to solving the problems described above by using dopant diffusion into a cladding region in order to construct a blocking junction of either npn or pnp type. The diffusion can be performed at an earlier stage of the process than other techniques. The process of construction of a waveguide structure begins in a conventional manner, with the laying down of a semi-insulating substrate, a first cladding or buffer layer which is doped with either n or p type dopant, and a waveguide core. However, the diffusion process to construct the regions of electrical isolation is then performed prior to the construction of further layers. The process penetration depth is much reduced and regions in which doping is undesirable such as the waveguide core can be removed during the subsequent process stages.

Figure 1:
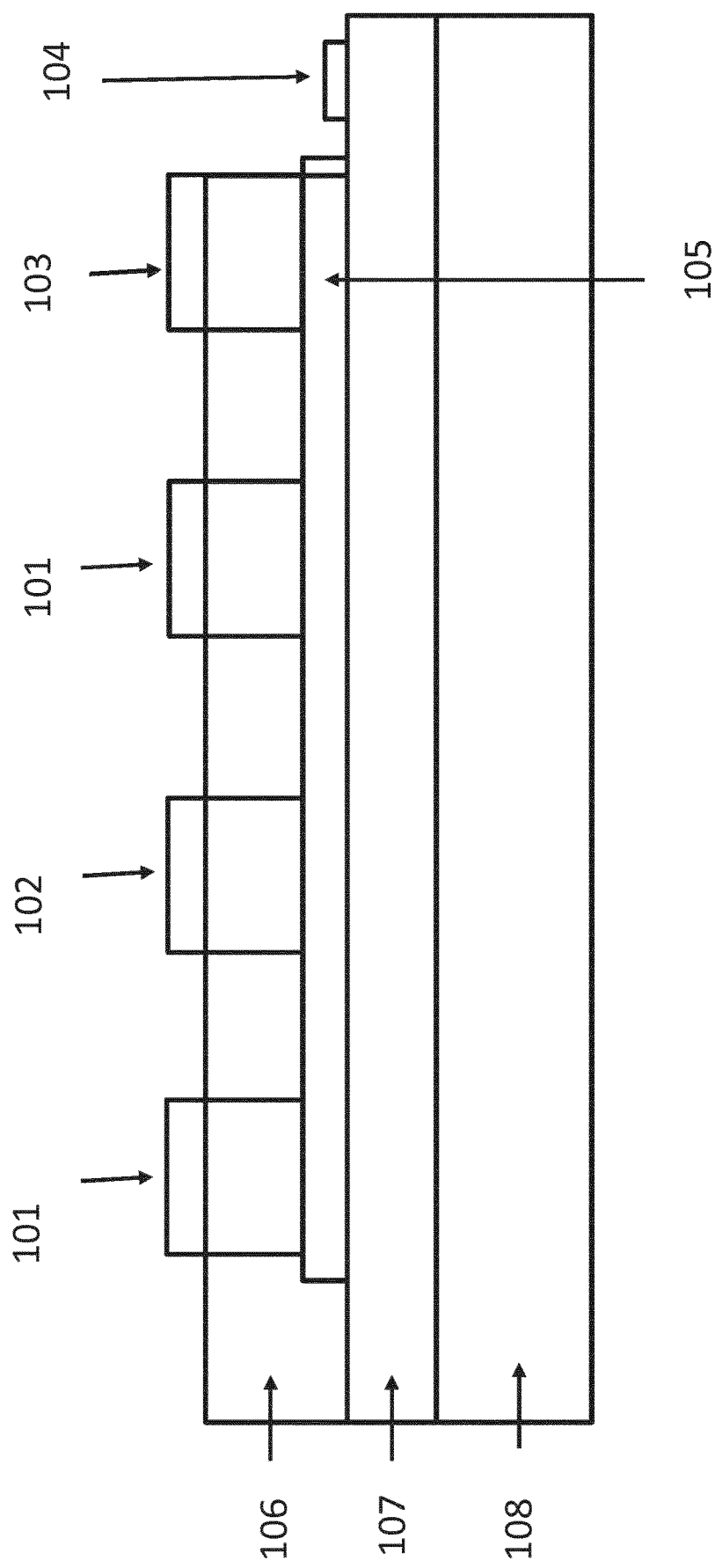
FIG. 1 is a cross sectional view of a photonic integrated circuit.
Figure 2:
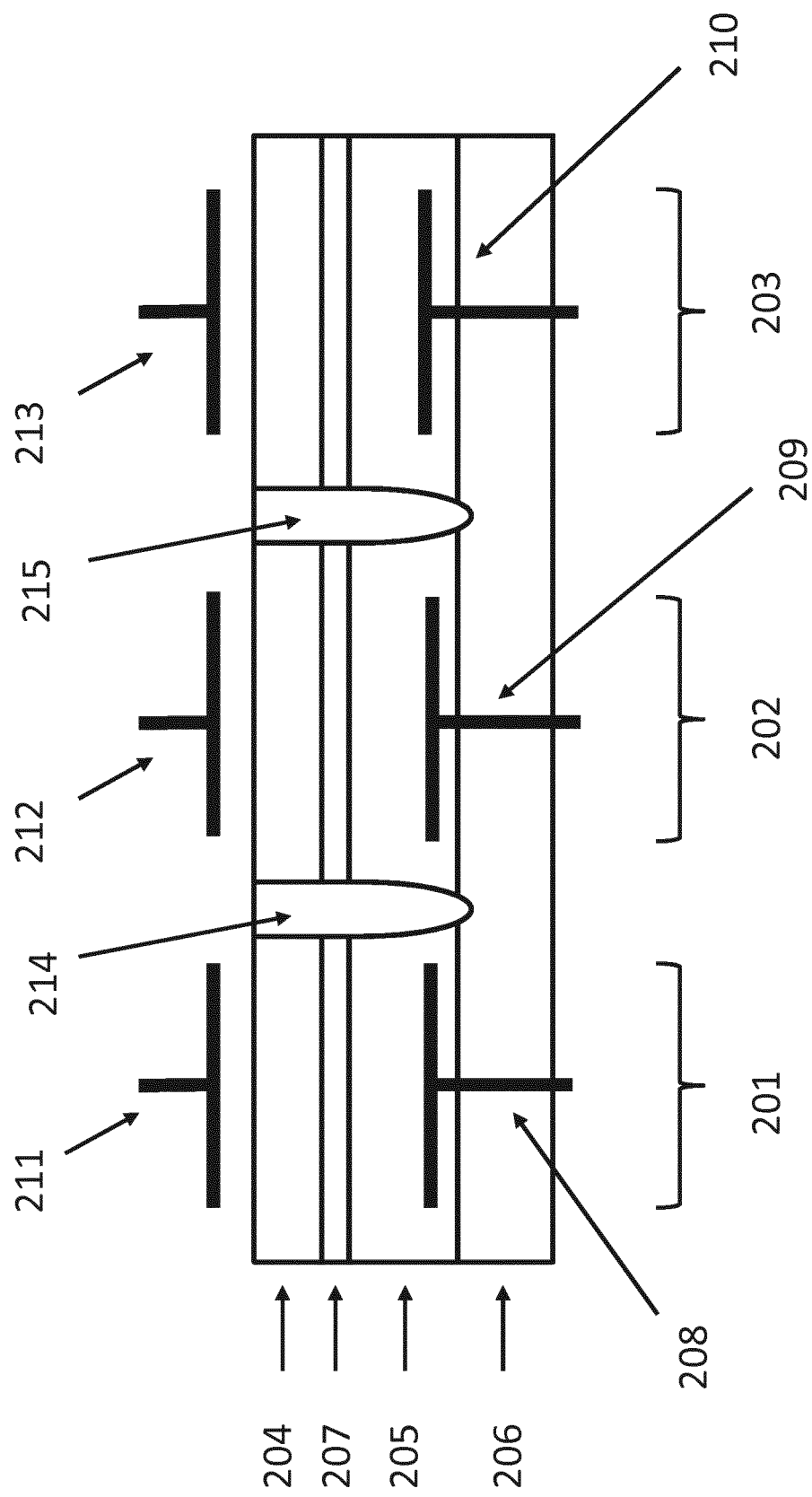
FIG. 2 is cross sectional view of a photonic integrated circuit with isolation regions.
Figure 3:
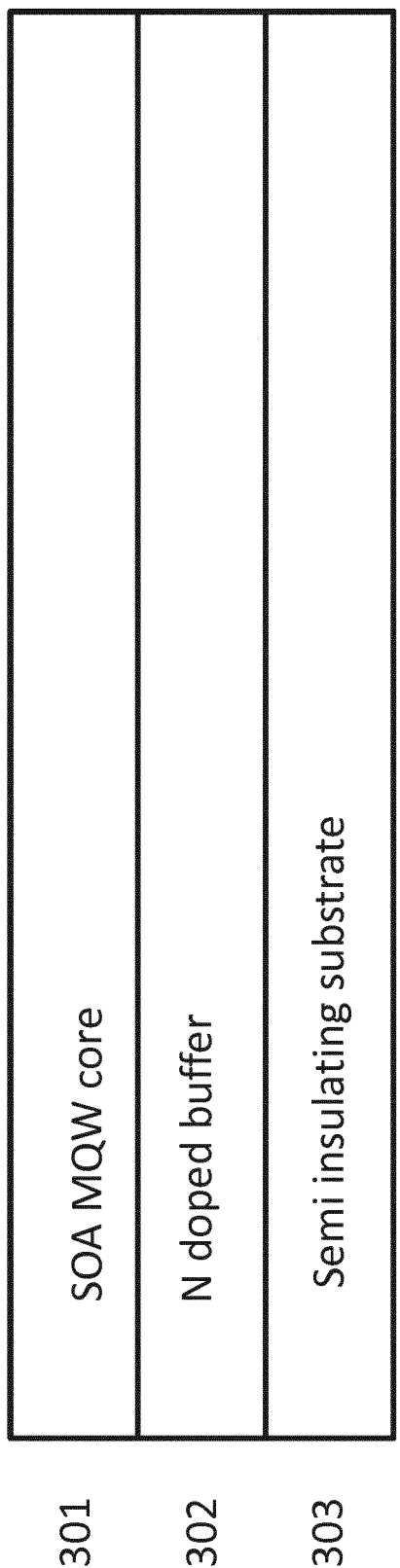
FIG. 3 is a cross sectional view of a waveguide structure for a photonic integrated circuit.
Figure 4:
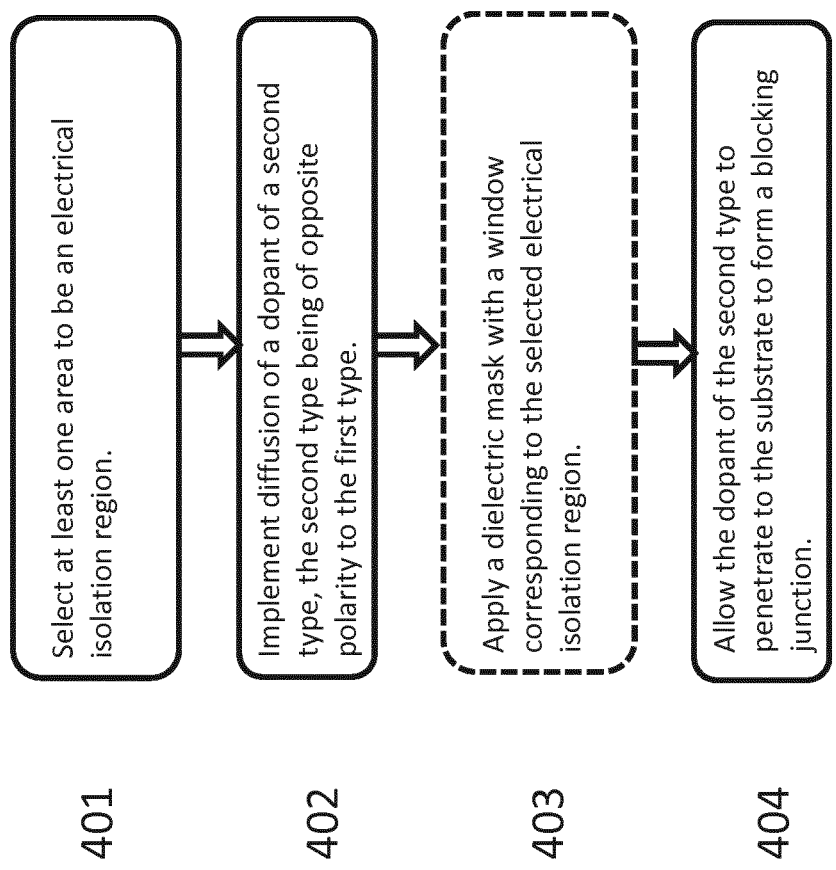
FIG. 4 is a flow chart illustrating the steps of a method of providing electrical isolation in a photonic integrated circuit according to an embodiment.
Figure 5:
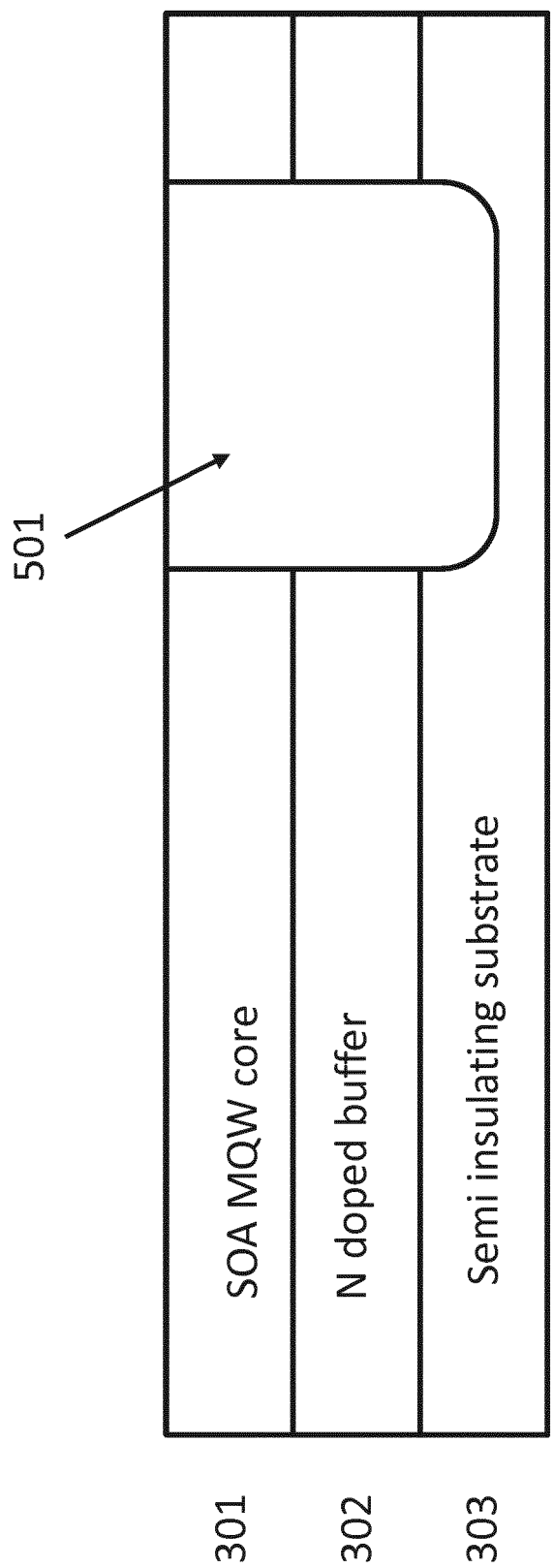
FIG. 5 is a cross sectional view of the waveguide structure after the diffusion process is complete.

The steps of constructing a photonic integrated circuit with electrical isolation according to an embodiment are illustrated in FIGS. 3 to 5. FIG. 4 is a flow diagram showing the steps of a method according to an embodiment and FIGS. 3 and 5 are cross sectional views of the layers of a photonic integrated circuit at different stages of the construction.

FIG. 3 is a cross sectional view of the initial layers of a waveguide structure prior to the implementation of the process of electrical isolation according to an embodiment. At this stage, the waveguide structure comprises a semi-insulating substrate 303, a doped buffer layer 302 and a core layer 301. The buffer layer has a dopant of a first type (n-type or p-type). In the embodiment illustrated, this first type is n-type. A dopant of a second type, used to create the electrical isolation region is, in this embodiment, p-type. However, the person skilled in the art will appreciate that p type doping may be used instead in the buffer layer. If this first dopant type is p type then the polarity of the second doping type is n type.

FIG. 4 is a flow chart which illustrates the stages of construction of an electrical isolation region according to an embodiment. The process is implemented on a waveguide structure as illustrated in FIG. 3. The construction of the electrical isolation region takes place before any further layers are placed above the core layer. Throughout the disclosure, it is assumed that the substrate is the base of the device, and therefore "above a layer" means on a side furthest from the substrate and likewise an "upper" surface refers to a surface on a side of a layer away from the substrate.

The first step of the process comprises the selection 401 of an area of the structure to be the electrical isolation region. This is followed by the implementation of diffusion 402 of a dopant of a second type, of opposite polarity to that of the buffer layer, into the structure. In the embodiment illustrated, Zinc, a p-type dopant, is used. However, in other embodiments, other p-type dopants, such as magnesium may be used. If the buffer is of p-type, then a dopant of n-type is used in the diffusion process.

In an embodiment, the diffusion is implemented by applying a dielectric mask 403 to the surface of the core layer of the structure. The dielectric mask comprises a window corresponding to the area of the surface above the region in which the electrical isolation region is to be constructed. In the embodiment illustrated, only one electrical isolation region is shown. However, the person skilled in the art will appreciate that multiple isolation regions may be constructed, in which case the dielectric mask will comprise a window for each of the isolation regions.

The diffusion continues until the dopant of the second type has penetrated as far as the semi-insulating substrate 404.

FIG. 5 is a cross sectional view of the waveguide structure after the diffusion process is complete. The semi-insulating substrate 301, the buffer layer 302 and the core layer 303 are shown as in FIG. 3. The structure now further comprises a region 501 which is, in this embodiment, zinc doped. This region, together with the regions either side of it, provides an npn blocking junction to provide electrical isolation. In another embodiment, the blocking junction will be a pnp junction. In an embodiment, the diffused dopant penetrates up to and partially the semi-insulating substrate. In other embodiments, the dopant penetrates into the substrate.

Figure 6:
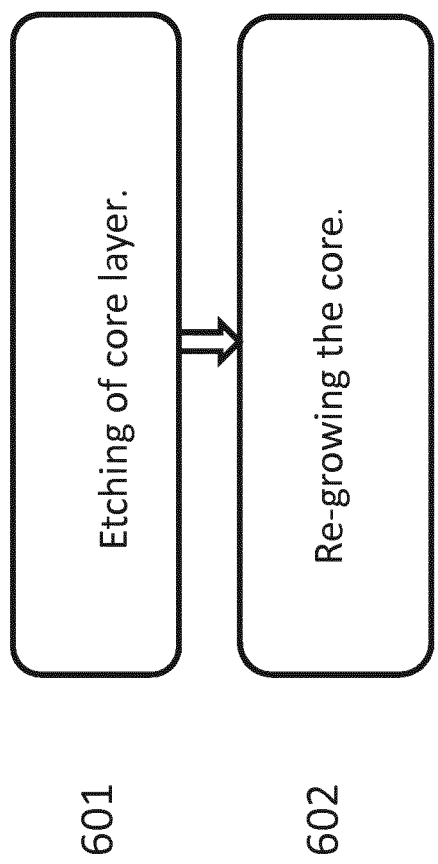
FIG. 6 is a flow chart illustrating further stages to the construction of an electrical isolation region in a waveguide structure such as illustrated in FIG. 3.
Figure 7:
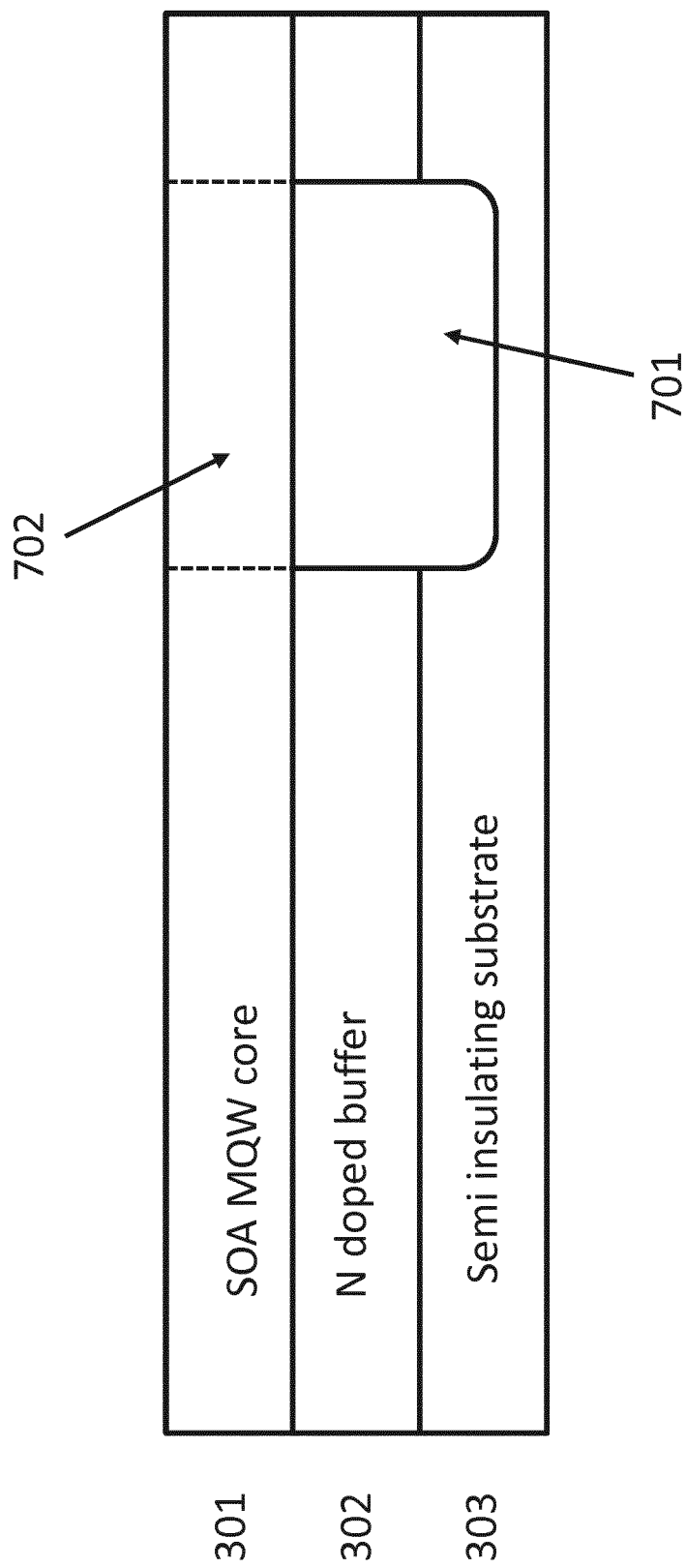
FIG. 7 is a cross sectional view of the waveguide structure illustrating the outcome of the process of FIG. 6.

FIG. 6 is a flow chart illustrating further stages to the construction of an electrical isolation region in a waveguide structure such as illustrated in FIG. 3. In an embodiment, the core layer is etched 601. The core layer is then regrown 602. FIG. 7 is a cross sectional view of the waveguide structure illustrating the outcome of the process of FIG. 6. The region 501 which has undergone dopant diffusion remains in the buffer layer and, in an embodiment in the semi-insulating substrate, thus providing an electrical isolation region 701. However, the core layer 301 no longer contains dopant, providing an intrinsic semiconductor region 702 for optical propagation.

Figure 8:
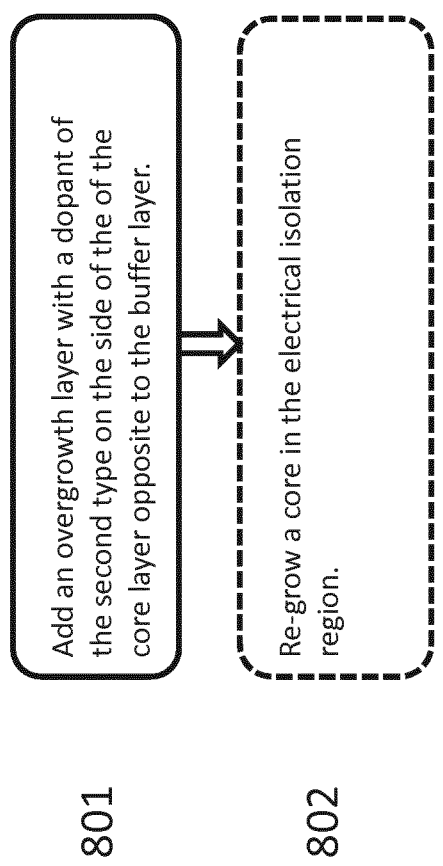
FIG. 8 is a flow chart illustrating further steps in the creation of an electrical isolation region according to an embodiment.
Figure 9:
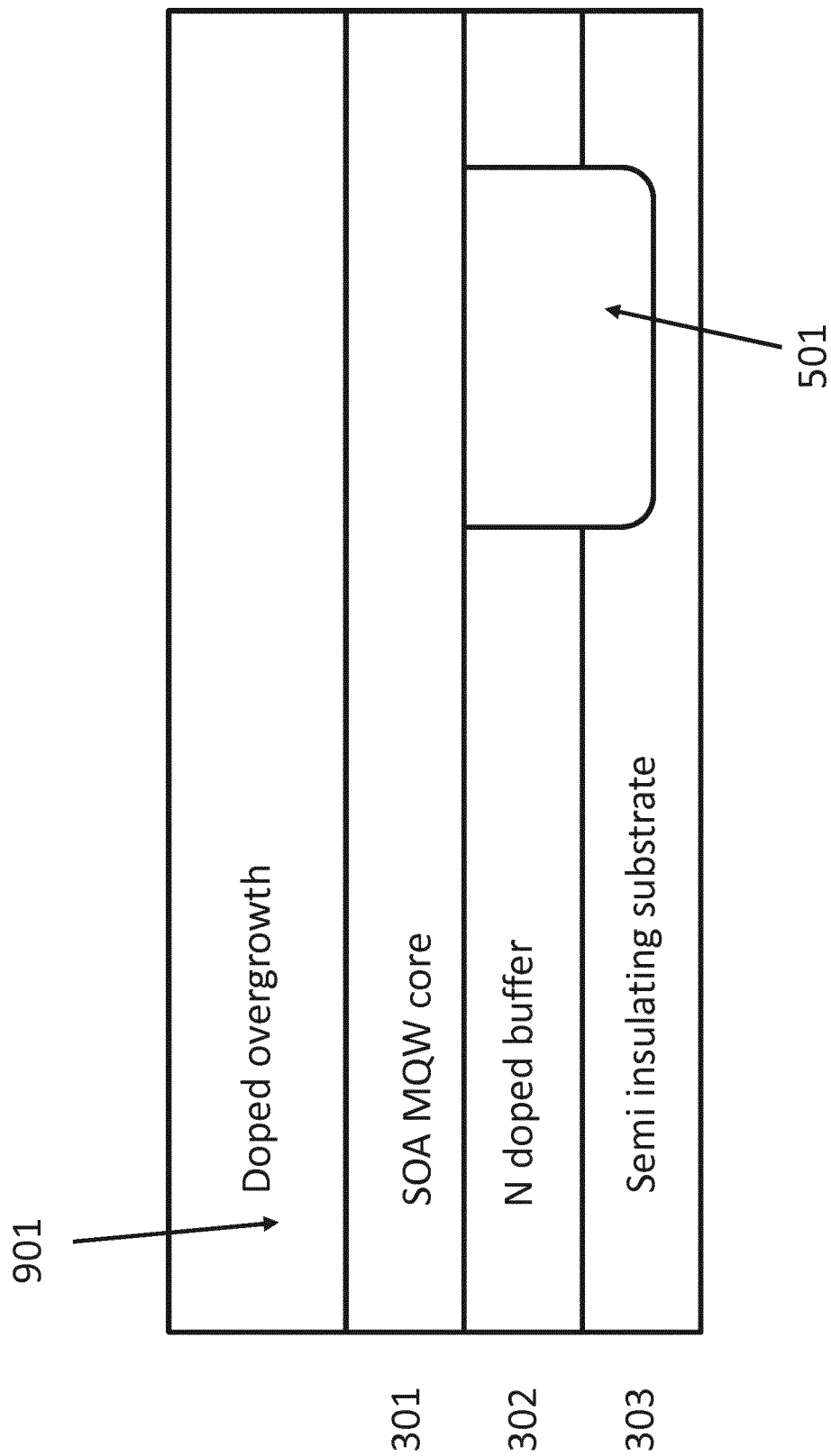
FIG. 9 is a cross section view of the outcome of step 801.
Figure 10:
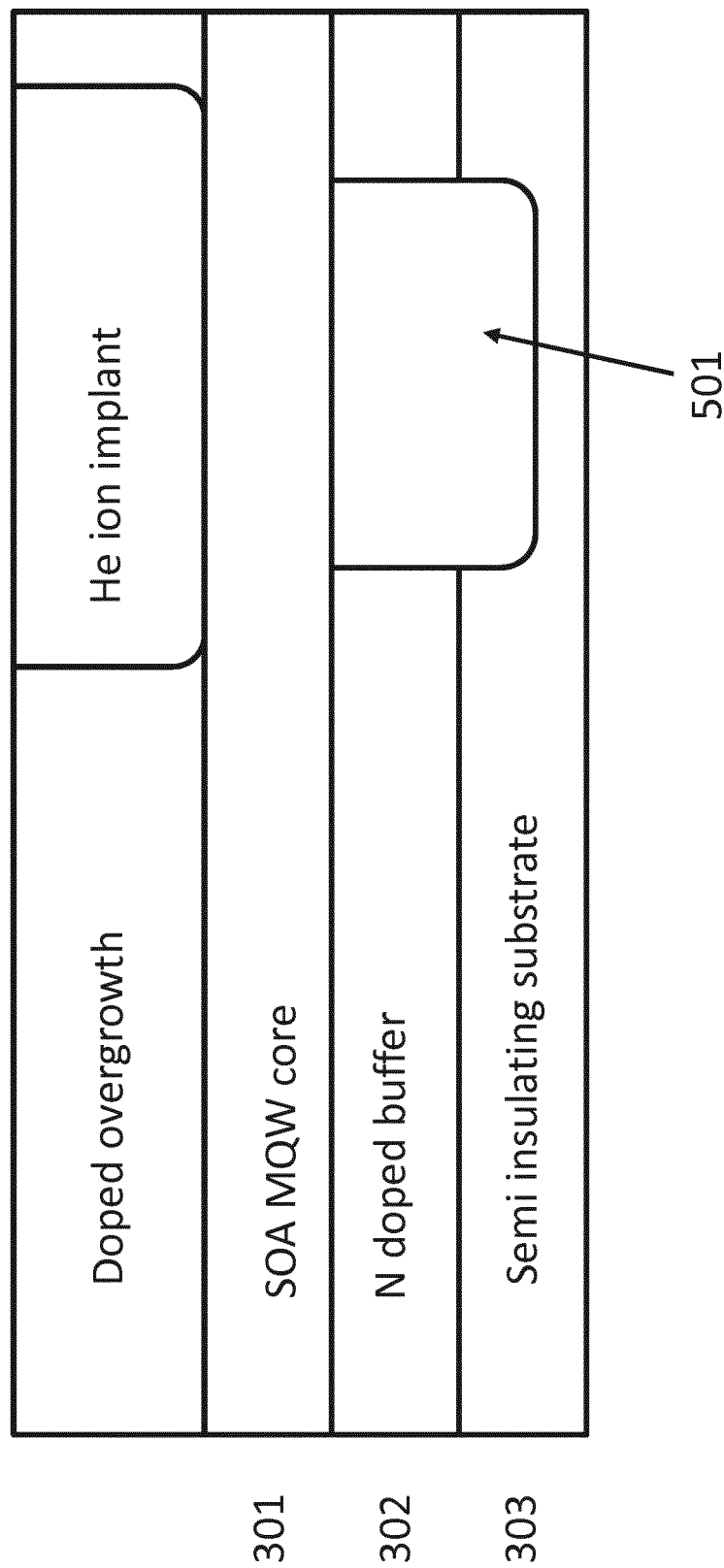
FIG. 10 is a cross section view of the outcome of step 802, showing the isolation region which has been subjected to Helium implantation.

FIG. 8 is a flow chart illustrating further steps in the creation of an electrical isolation region according to an embodiment. An overgrowth region comprising dopant of the second type, is added to the structure 801, above the core layer. In an embodiment, an electrical isolation region is constructed in the overgrowth region by Helium implantation 802. FIG. 9 is a cross section view of the outcome of step 801, showing the overgrowth layer 901. FIG. 10 is a cross section view of the outcome of step 802, showing the isolation region 501 which has been subjected to Helium implantation.

Figure 11:
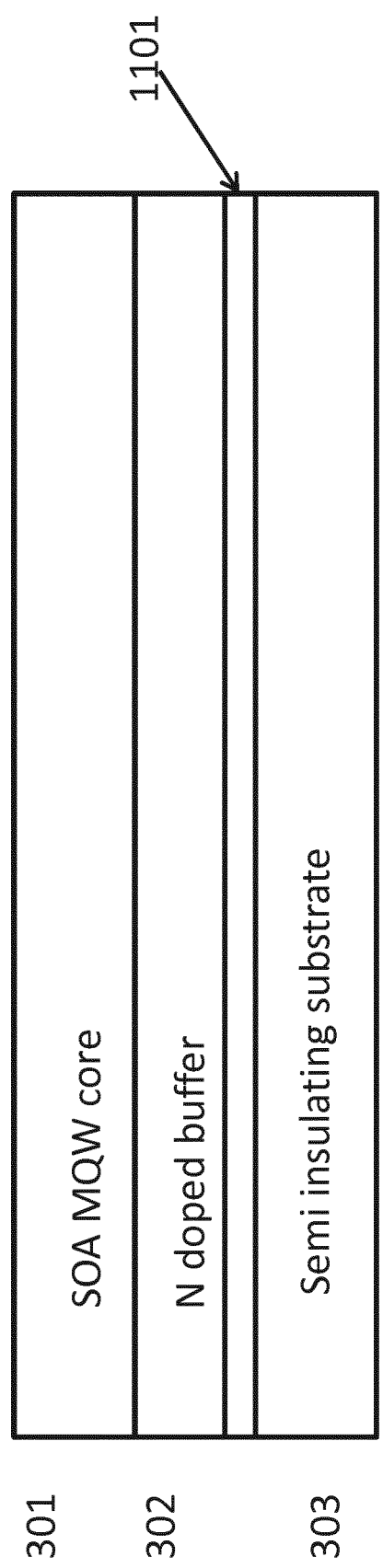
FIG. 11 is a cross sectional view of a waveguide structure according to an embodiment.
Figure 12:
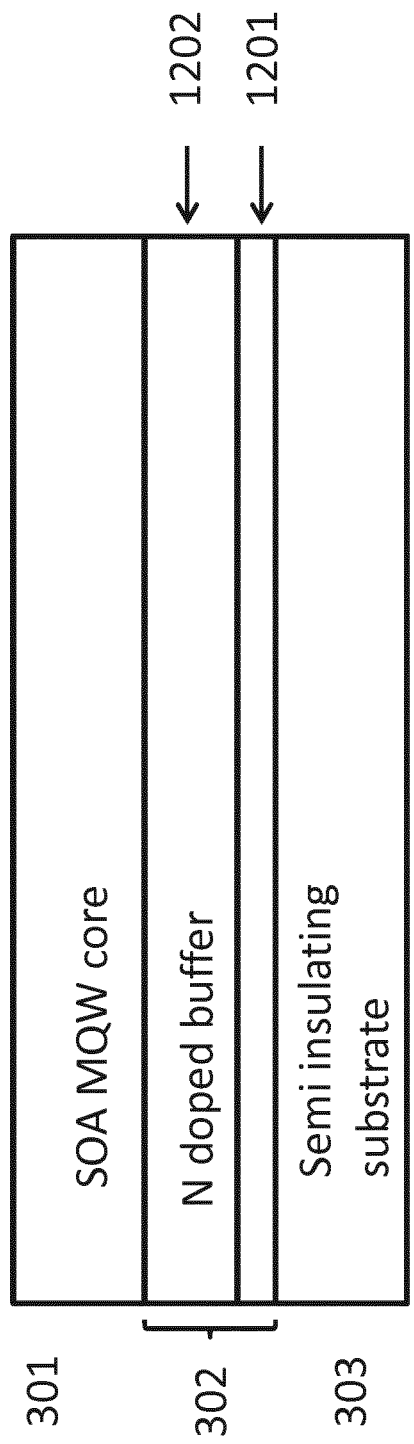
FIG. 12 is a cross sectional view of a waveguide structure for according to an embodiment.
Figure 13:
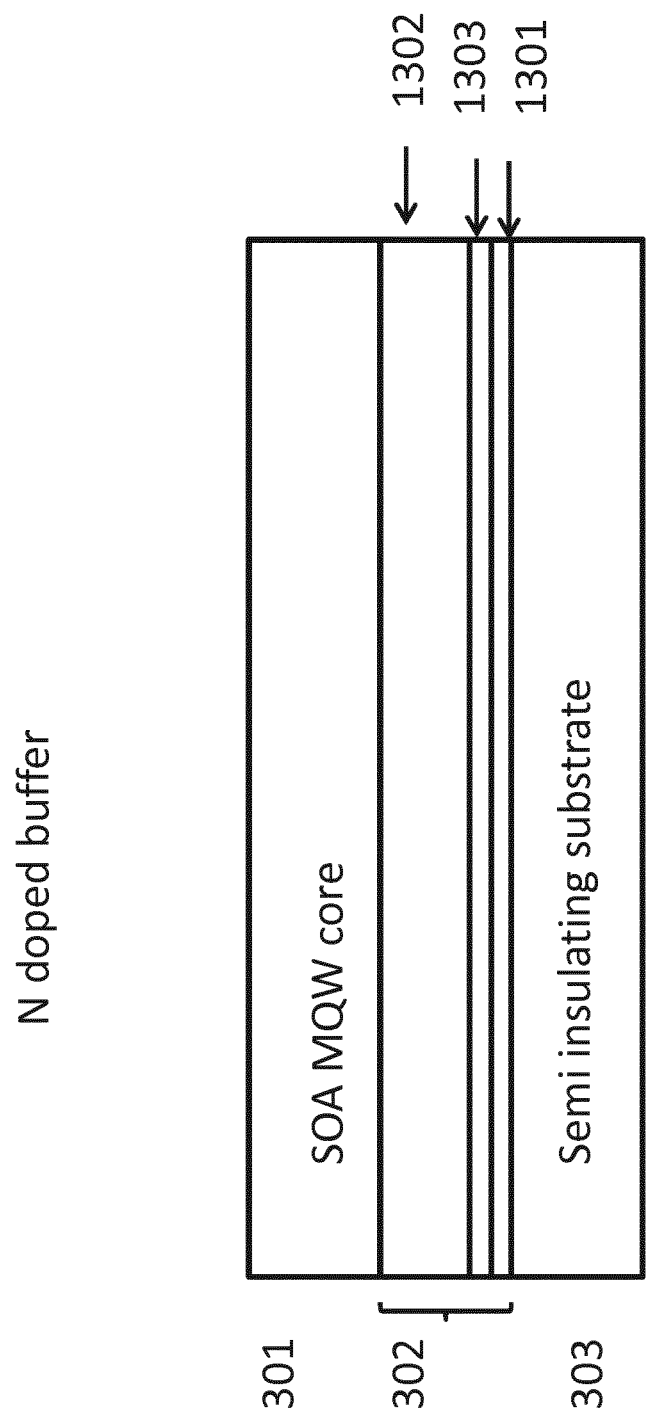
FIG. 13 is a cross sectional view of a waveguide structure according to an embodiment.

In a further embodiment, there is provided a diffusion barrier layer between the buffer layer and the substrate. The purpose of this layer is to act as a barrier to the diffusion of dopant into the substrate. FIG. 11 is a cross sectional view of a waveguide structure for a photonic integrated circuit according to this embodiment, prior to the addition of dopant. In the embodiment of FIG. 11, an additional diffusion barrier layer 1101 is provided. The diffusion barrier layer may comprise a material with reduced diffusivity with respect to the N-buffer layer. In an embodiment, the diffusion barrier layer comprises Aluminium Indium Arsenide. In other embodiments, Aluminium Gallium Indium Arsenide is used. In another embodiment, Indium Gallium Arsenide is used. In yet another embodiment Indium Gallium Arsenide Phosphide is used. However, the person skilled in the art will appreciate that other materials may be used. The skilled person will appreciate also that alloys of Indium, Aluminium, Gallium and Arsenic may contain different portions of the constituent materials and the invention is not limited to any one. In the embodiment of FIG. 11, the diffusion barrier layer is between the buffer layer and the substrate. In an alternative embodiment, the diffusion barrier layer is within the buffer layer. Typically, the diffusion barrier layer is located towards the bottom of this layer, nearer to the substrate than the core. In this arrangement, the diffusion buffer layer typically comprises a first sublayer located adjacent the substrate, which comprises a diffusion barrier layer, and a second sublayer between the diffusion barrier layer and the core, without the diffusion barrier layer. FIG. 12 is a cross section view of a waveguide structure according to this embodiment. There is illustrated the first sublayer 1201, comprising a diffusion barrier, and the second sulayer 1202, which does not have a diffusion layer barrier. In a further embodiment, the buffer layer comprises three sublayers, a first layer adjacent the substrate, which has no diffusion barrier, a second sublayer, adjacent the core, which has no diffusion barrier, and a third sublayer, between the first and second sublayers, which comprises a diffusion barrier. In an embodiment, the first sublayer is thinner than the second sublayer. FIG. 13 is a cross section view of a waveguide structure according to this embodiment. There is illustrated the first sublayer 1301 and the second sublayer 1302, which do not have a diffusion barrier, and the third sublayer 1303, which has a diffusion barrier.

Figure 14:
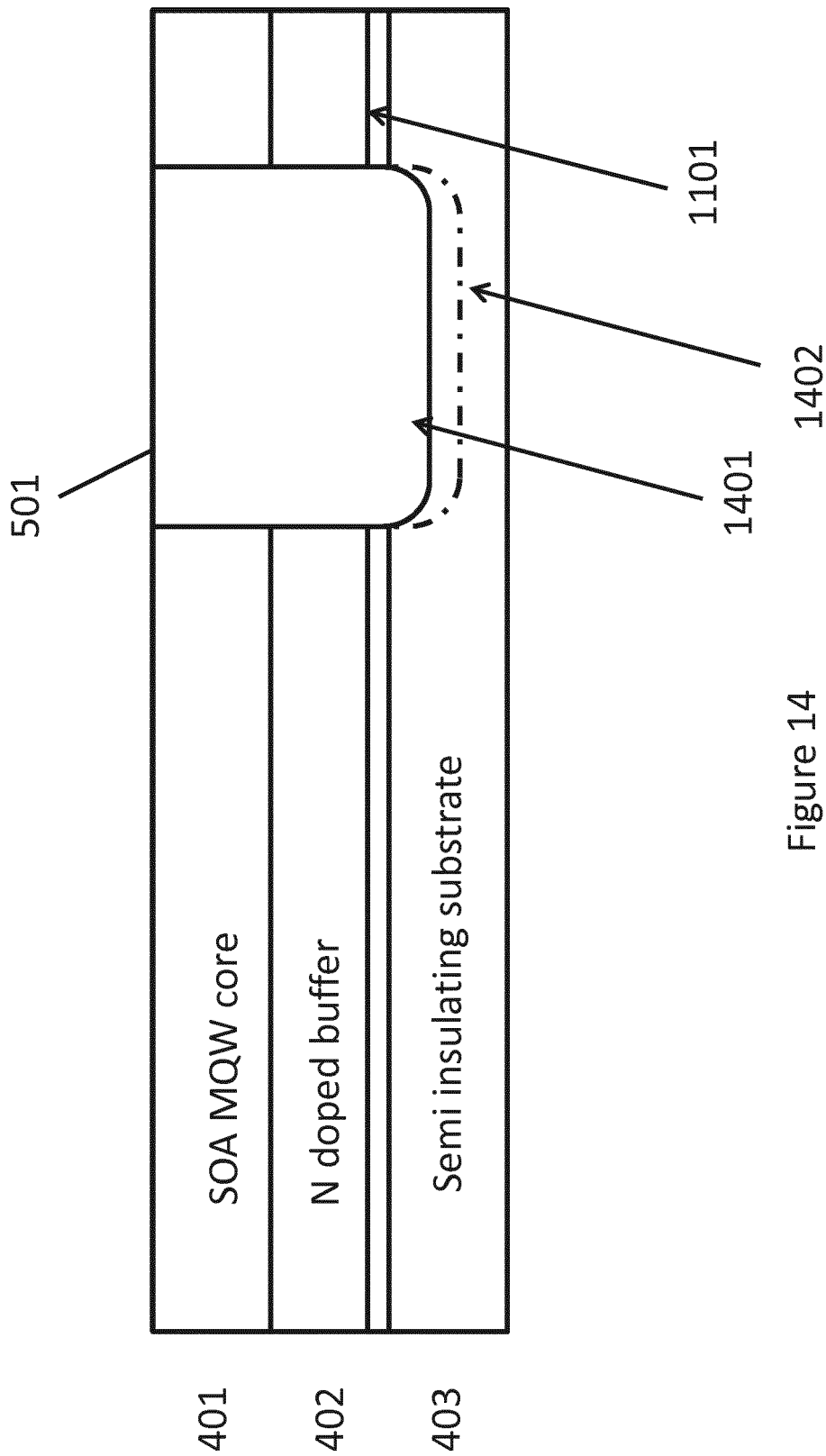
FIG. 14 is a cross sectional view of a waveguide structure for a photonic integrated circuit according to an embodiment, showing the isolation regime restricted by a diffusion barrier layer.

FIG. 14 is a cross sectional view of a waveguide structure according to the embodiment of FIG. 11, after the addition of the dopant. The diffusion barrier layer is not a complete barrier to diffusion of the dopant. However, the amount of dopant which diffuses is reduced and the region 1401 into which the dopant diffuses is reduced, compared to a typical diffusion region 1402 which would occur without the barrier.

Figure 15:
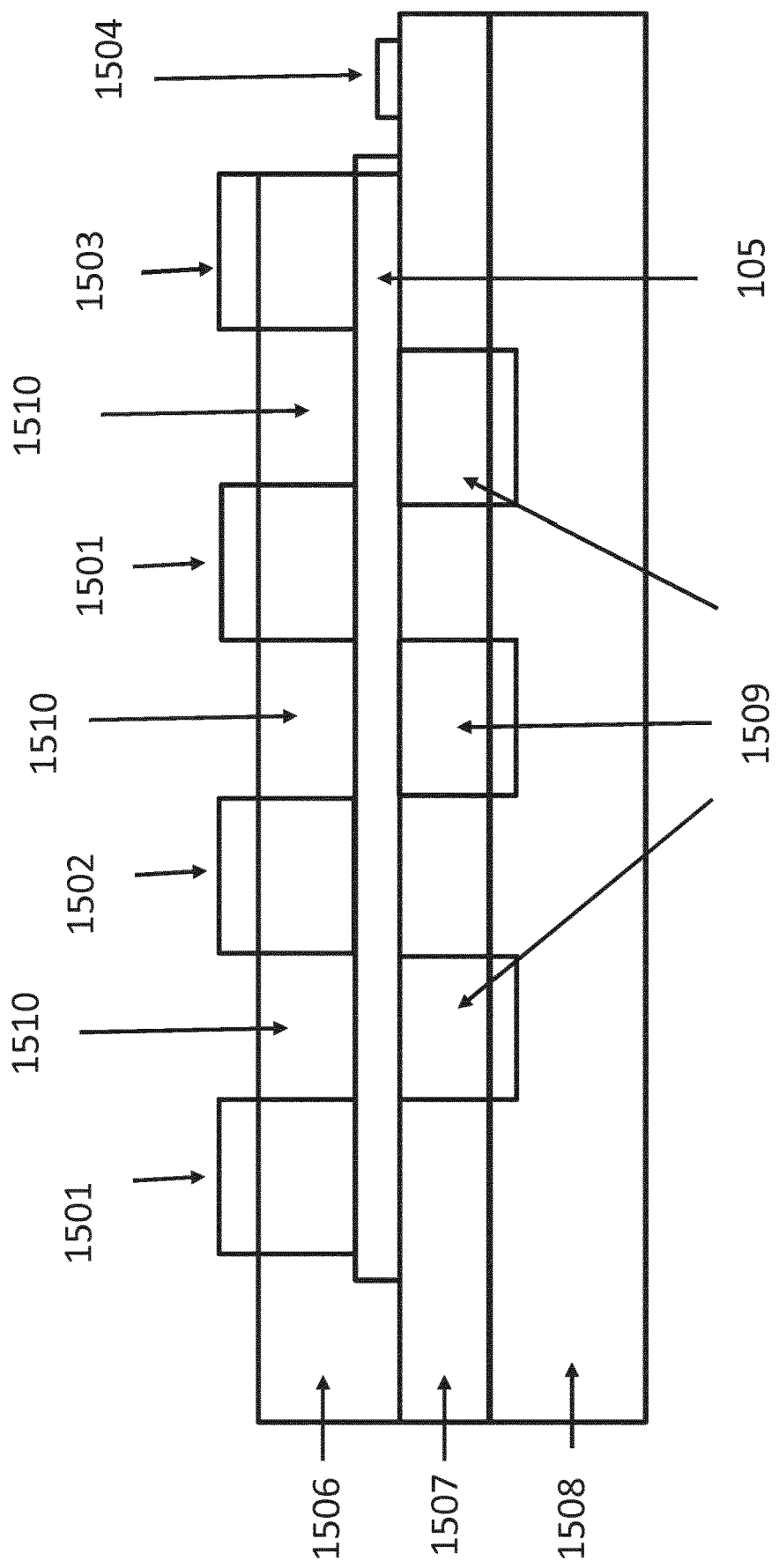
FIG. 15 is a cross sectional view of a typical arrangement in which the methods disclosed herein may be used.

The above embodiments illustrate a waveguide structure with a single isolation region. The purpose of these isolation regions is to electrically isolate two or more optoelectronic components, such as phase modulators, semiconductor optical amplifiers, sections of a multiple section laser etc. FIG. 15 is a cross sectional view of a typical arrangement in which the above techniques may be used. The photonic integrated circuit of FIG. 15 comprises two semi-conductor optical amplifiers (SOA) 1501, a phase modulator 1502 and a Complementary Tap Detector (CTAP) 1503, with cathode 1504. These devices are optically connected by the core layer 1505, which is located between an overgrowth layer 1506 and a buffer layer 1507, the latter supported by a semi-insulating substrate 1108. Electrical isolation is provided by first isolation regions 1509, created by dopant diffusion, in the buffer layer and by second isolation regions 1510, created by Helium implantation, in the overgrowth layer. The person skilled in the art will appreciate that the above described techniques and structures are suitable for a wide range of photonic components and the invention is not limited to any device or combination of devices. Any electrical isolation between lateral subsections is possible.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A method of providing electrical isolation between subsections in a waveguide structure for a photonic integrated device, wherein the waveguide structure comprises a substrate, a buffer layer on the substrate, and a core layer on the buffer layer, the buffer layer comprises a dopant of a first type being n-type or p-type, and the method comprises:
 diffusing, prior to adding any layer above the core layer, a dopant of a second type into the waveguide structure,
  the second type being of opposite polarity to the first type;
 allowing the dopant of the second type to penetrate through the buffer layer to the substrate to form a blocking junction;
 adding an overgrowth layer with the dopant of the second type on top of the core layer; and
 creating an isolation region in the overgrowth layer by helium implantation.

2. The method of claim 1, wherein diffusing the dopant into the waveguide structure comprises:
 selecting at least one area to be an electrical isolation region; and
 applying a dielectric mask to an upper surface of the core layer,
  wherein a window in the dielectric mask exposes an area of the upper surface corresponding to the electrical isolation region.

3. The method of claim 1, further comprising:
 removing dopant from the core layer by etching and re-growing at least a portion of the core layer.

4. The method of claim 1, wherein the dopant of the first type is n-type dopant and the dopant of the second type is p-type dopant.

5. The method of claim 4, wherein the dopant of the second type is zinc or magnesium.

6. The method of claim 1, wherein the waveguide structure comprises a diffusion barrier layer located between the substrate and the buffer layer or within the buffer layer.

7. The method of claim 6, wherein the buffer layer comprises:
 a first sublayer, adjacent the substrate, which comprises the diffusion barrier layer, and
 a second sublayer, between the first sublayer and the core layer, which does not have a diffusion barrier layer.

8. The method of claim 6, wherein the buffer layer comprises:
 a first sublayer, adjacent the substrate, which has no diffusion barrier,
 a second sublayer, adjacent the core layer, which has no diffusion barrier, and
 a third sublayer, between the first sublayer and the second sublayer, which comprises a diffusion barrier.

9. The method of claim 8, wherein the first sublayer is thinner than the second sublayer.

10. A waveguide structure for a photonic integrated circuit comprising:
 a substrate;
 a buffer layer comprising a dopant of a first type;
 a core layer,
  wherein the buffer layer is located between the substrate and the core layer; and
 at least one electrical isolation region comprising a first isolation region within the buffer layer and a dopant of a second type diffused into the first isolation region,
  wherein the dopant of the first type and the dopant of the second type are of opposite polarities; and an overgrowth layer, above the core layer, comprising the dopant of the second type,
 wherein the at least one electrical isolation region further comprises helium ions implanted into the overgrowth layer.

11. The waveguide structure of claim 10, wherein the dopant of the first type is n-type dopant and the dopant of the second type is p-type dopant.

12. The waveguide structure of claim 11, wherein the dopant of the second type is zinc or magnesium.

13. The waveguide structure of claim 10, further comprising:
 a diffusion barrier layer located between the substrate and the buffer layer or within the buffer layer.

14. The waveguide structure of claim 13, wherein the buffer layer comprises:
 a first sublayer, adjacent the substrate, which comprises the diffusion barrier layer; and
 a second sublayer, between the first sublayer and the core layer, which does not have a diffusion barrier layer.

15. The waveguide structure of claim 10, wherein the buffer layer comprises:
 a first sublayer, adjacent the substrate, which has no diffusion barrier;
 a second sublayer, adjacent the core layer, which has no diffusion barrier; and
 a third sublayer, between the first and second sublayers, which comprises a diffusion barrier.

16. The waveguide structure of claim 15, wherein the first sublayer is thinner than the second sublayer.

17. A method of providing electrical isolation between subsections in a waveguide structure for a photonic integrated device, wherein
 the waveguide structure comprises:
  a substrate,
  a buffer layer on the substrate,
  a core layer on the buffer layer, and
  a diffusion barrier layer located between the substrate and the buffer layer or within the buffer layer,
   wherein the buffer layer comprises:
    a dopant of a first type being n-type or p-type;
    a first sublayer, adjacent the substrate, which comprises the diffusion barrier layer, and
    a second sublayer, between the first sublayer and the core layer, which does not have a diffusion barrier layer; and
 the method comprises:
  diffusing, prior to adding any layer above the core layer, a dopant of a second type into the waveguide structure,
   the second type being of opposite polarity to the first type; and
  allowing the dopant of the second type to penetrate through the buffer layer to the substrate to form a blocking junction.

18. A waveguide structure for a photonic integrated circuit comprising:
 a substrate;
 a buffer layer comprising a dopant of a first type;
 a core layer,
  wherein the buffer layer is located between the substrate and the core layer;
 at least one electrical isolation region comprising a first isolation region within the buffer layer and a dopant of a second type diffused into the first isolation region,
  wherein the dopant of the first type and the dopant of the second type are of opposite polarities; and a diffusion barrier layer located between the substrate and the buffer layer or within the buffer layer,
wherein the buffer layer comprises:
a first sublayer, adjacent the substrate, which comprises the diffusion barrier layer; and
a second sublayer, between the first sublayer and the core layer, which does not have a diffusion barrier layer.

19. A method of providing electrical isolation between subsections in a waveguide structure for a photonic integrated device, wherein the waveguide structure comprises:
a substrate,
a buffer layer on the substrate,
a core layer on the buffer layer, and
a diffusion barrier layer located within the buffer layer,
wherein the buffer layer comprises:
a dopant of a first type being n-type or p-type,
a first sublayer, adjacent the substrate, which has no diffusion barrier,
a second sublayer, adjacent the core layer, which has no diffusion barrier, and
a third sublayer, between the first sublayer and the second sublayer, which comprises a diffusion barrier; and
the method comprises:
diffusing, prior to adding any layer above the core layer, a dopant of a second type into the waveguide structure, the second type being of opposite polarity to the first type; and
allowing the dopant of the second type to penetrate through the buffer layer to the substrate to form a blocking junction.

20. A waveguide structure for a photonic integrated circuit comprising:
a substrate;
a buffer layer comprising a dopant of a first type;
a core layer,
wherein the buffer layer is located between the substrate and the core layer;
at least one electrical isolation region comprising a first isolation region within the buffer layer and a dopant of a second type diffused into the first isolation region,
wherein the dopant of the first type and the dopant of the second type are of opposite polarities; and
a diffusion barrier layer located between the substrate and the buffer layer or within the buffer layer,
wherein the buffer layer comprises:
a first sublayer, adjacent the substrate, which has no diffusion barrier;
a second sublayer, adjacent the core layer, which has no diffusion barrier; and
a third sublayer, between the first and second sublayers, which comprises a diffusion barrier.

* * * * *